United States Patent [19]
Yamaguchi et al.

[11] Patent Number: 4,943,949
[45] Date of Patent: Jul. 24, 1990

[54] SEMICONDUCTOR MEMORY INCLUDING MEANS FOR NOISE SUPPRESSION

[75] Inventors: Yasunori Yamaguchi, Tachikawa; Kanji Oishi, Koganei; Kazuyuki Miyazawa, Kodaira, all of Japan

[73] Assignee: Hitachi, Ltd., Tokyo, Japan

[21] Appl. No.: 802,197

[22] Filed: Nov. 25, 1985

[30] Foreign Application Priority Data

Nov. 26, 1984 [JP] Japan .................................. 59-248105

[51] Int. Cl.$^5$ ............................................. G11C 13/00
[52] U.S. Cl. .................... 365/206; 365/149; 365/210
[58] Field of Search ............... 365/206, 207, 210, 200, 365/203, 149, 189.01

[56] References Cited

U.S. PATENT DOCUMENTS

| | | | |
|---|---|---|---|
| 4,551,820 | 11/1985 | Matsuura | 365/210 |
| 4,602,355 | 7/1986 | Watanabe | 365/206 |
| 4,719,597 | 1/1988 | Kumanoya et al. | 365/207 |

FOREIGN PATENT DOCUMENTS 0579656 11/1977 U.S.S.R. .............................. 365/206
2087183A 5/1982 United Kingdom ................ 365/206

*Primary Examiner*—Terrell W. Fears
*Attorney, Agent, or Firm*—Antonelli, Terry, Stout & Kraus

[57] ABSTRACT

A half precharge type dynamic RAM has a pair of data lines to which a plurality of dynamic memory cells are coupled. The paired data lines are set in advance before a read operation at a reference potential which is equal to one half of the supply voltage. One of the paired data lines is switched to have a higher or lower level than the reference potential by the memory cell selected. The potential difference applied between the paired data lines is amplified by the operation of a sense amplifier. Here, an address selecting MOSFET in the memory cell has a gate capacitance which will undesirably couple a word line and the data lines. As a result, one of the data lines has its level changed in an undesired manner. The noise inparted between the paired data lines by such coupling noise components can be substantially neglected by adopting a dummy MOSFET which operates to impart coupling noise components corresponding to the noise components caused by the address selecting MOSFET gate capacitance.

20 Claims, 3 Drawing Sheets

SEMICONDUCTOR MEMORY INCLUDING MEANS FOR NOISE SUPPRESSION

BACKGROUND OF THE INVENTION

The present invention relates to a semiconductor memory and, more particularly, to a technique which is effective when used in a dynamic random access memory (which will be hereinafter referred to as an "RAM") of a half precharge system, for example, for precharging a data line to a half level of the supply voltage.

A 1-bit memory cell of a dynamic RAM is composed of an information storing capacitor Cs and an address selecting insulated gate field effect transistor (which will be hereinafter referred to as a "MOSFET") Qm and stores information as logic "1" and "0" represented by the presence or absence of charges in the capacitor Cs. The read operation of the information is conducted by connecting the capacitor Cs with a common data line D while the MOSFET Qm is ON and by sensing how the potential of the data line D changes in accordance with the quantity of charges stored in the capacitor Cs. When the memory array is highly integrated to have a high capacity, a memory cell MC is miniaturized, and many memory cells are connected with the data line D. In this case, the ratio Cs/Co of the capacitor Cs to the stray capacity Co of the data line D takes a very small value. As a result, the potential change of the data line D due to the quantity of charges stored in the capacitor Cs takes a very minute value.

In order to generate a reference potential when such fine value is to be detected, the (half precharge) concept of precharging the data line in advance with a substantially half level of the supply voltage Vcc to use the half precharge level has already been developed by us (refer to our Japanese Patent Application No. 57-164831, for example).

However, our further studies have revealed that such precharge system using of Vcc/2 will raise the following problems. In the operation of selecting the word line, more specifically, a selected memory cell is coupled to one data line. Here, the address selecting MOSFET in the memory cell has an interelectrode capacitance, a gate capacitance or a MOS capacitance which cannot be considered a negligible coupling capacitance. As a result, if a selection signal is fed to the word line, the undesirable coupling between the word line through the MOS capacitance and one data line causes the undesirable potential fluctuations which are considered noise to be imparted to the one data line. The other data line is left at the precharge level. This degrades the margin of the fine level read from the aforementioned memory cell.

SUMMARY OF THE INVENTION

An object of the present invention is to provide a dynamic RAM which is intended to have its operating margin improved.

The aforementioned and other objects and novel features of the present invention will become apparent from the following description to be made with reference to the accompanying drawings.

The summary of the representative embodiment of the invention to be disclosed herein will be described in the following. Specifically, the half (Vcc/2) precharge type dynamic RAM is equipped with a dummy MOSFET and a dummy word line so that noise between complementary data lines may be relatively reduced by establishing coupling noise equivalent to the coupling noise due to a word line selection signal appearing on a data line through an address selecting MOSFET of a memory cell by making use of the capacitance coupling through that dummy MOSFET between the dummy word line and the data line.

DESCRIPTION OF THE PREFERRED EMBODIMENTS

Embodiment 1

Figure 1:
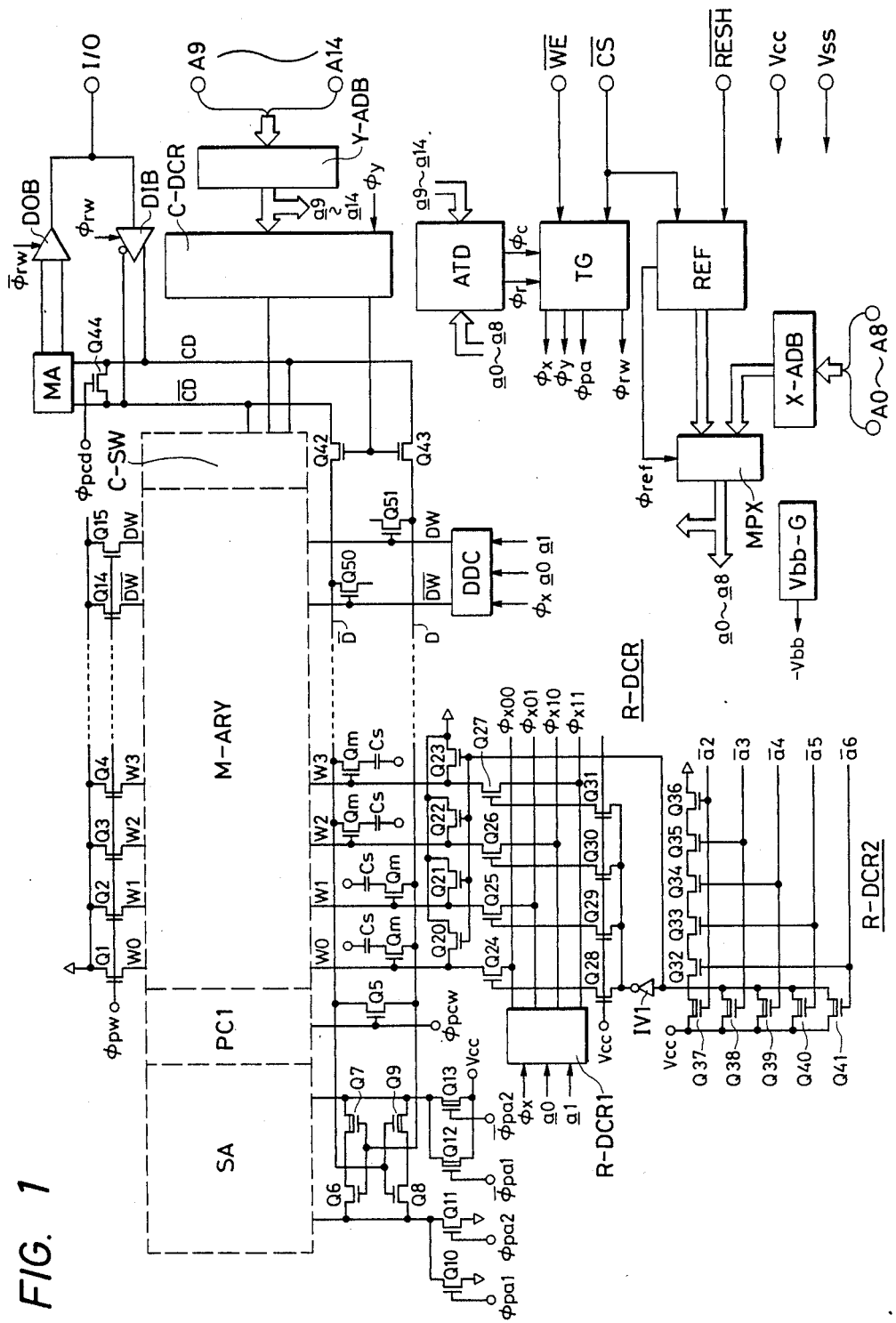
FIG. 1 is a circuit diagram showing one embodiment of the present invention.

FIG. 1 is a circuit diagram showing one embodiment of the dynamic RAM according to the present invention. The individual circuit elements of the same Figure are fabricated on one semiconductor substrate of single crystalline silicon by the well-known technique of fabricating a CMOS (i.e., complementary MOS) integrated circuit. In the description to be made hereinafter, the MOSFET (i.e., the insulated gate field effect transistor is of the N-channel MOSFET, unless otherwise specified. In the same Figure, the MOSFET in which a straight line is added between its source and drain is of the P-channel type.

Although the invention is not specifically limited to this configuration, the integrated circuit is formed on the semiconductor substrate which is made of P-type single crystalline silicon. The N-channel MOSFET is constructed of: a source region and a drain region formed on the surface of such semiconductor substrate; and a gate electrode made of polycrystalline silicon and formed on the surface of the semiconductor substrate between the source and drain regions through a relatively thin gate insulating film. The P-channel MOSFET is formed in an N-type well region which is formed on the surface of the semiconductor substrate. As a result, the semiconductor substrate constructs a substrate gate shared among the plural N-channel MOSFETs formed thereon. The N-type well region constructs a substrate gate of the P-channel MOSFET formed thereon. The substrate gate of the P-channel MOSFET, i.e., the N-type well region is coupled to the supply terminal Vcc of FIG. 1.

The more specific construction of the integrated circuit will be roughly described in the following although it is no shown because it has no direct relation to the present invention by itself.

More specifically, the surface of the semiconductor substrate made of the P-type single crystalline silicon and formed with the N-type well region is formed partially at its portion other than the activated regions such as a semiconductor wiring region, a capacitor forming region, the source and drain regions of the N- and P-channel MOSFETs and the channel (or gate) forming region with a relatively thick field insulating film by the well-known local oxidation. The capacitor forming region is formed thereon with a first polycrystalline silicon layer through a relatively thin insulating (or oxide) film to be used as a dielectric film. The first polycrystalline silicon layer is extended over the field insulating film. The first polycrystalline silicon layer on the capacitor forming region constructs the plate electrode of the capacitor whereas the first polycrystalline silicon layer on the field insulating film constructs the wires. The surfaces of the first layer polycrystalline silicon layers are formed with a thin oxide film which is prepared by its own thermal oxidation. On the semiconductor substrate surface at the capacitor forming region, there is induced a channel region by applying a suitable voltage such as the supply voltage to the first polycrystalline silicon layer. As a result, a capacitor is formed which is constructed of the first polycrystalline silicon layer, the thin insulating film and the channel region.

On the channel forming region of the MOSFET, is formed through the thin gate oxide film a second polycrystalline silicon layer which is to be used as a gate electrode. This second polycrystalline silicon layer is extended over the field insulating film and the first polycrystalline silicon layer. The word lines and the dummy word lines of a memory array to be described hereinafter are made of the second polycrystalline silicon layer, although the invention is not especially limited to this configuration.

The active region surfaces, which are not covered with the field insulating film and the first and second polycrystalline silicon layers, are formed with source and drain regions and semiconductor wiring regions by the well-known impurity introducing technique using those field insulating film and silicon layers as doping masks.

The surface of the semiconductor substrate including the first and second polycrystalline silicon layers is formed with a relatively thick inter-layer insulating film, on which is formed a conductor layer made of aluminum. This conductor layer is electrically coupled to the polycrystalline silicon layers and the semiconductor region through contact holes which are formed in an insulating film underlying the conductor layer. The data lines in the memory array to be described hereinafter are made of the conductor layer extended over that inter-layer insulating film, although the invention is not especially limited to that configuration.

The surface of the semiconductor substrate including the inter-layer insulating film and the conductor layer is covered with a final passivation film which is composed of a silicon nitride film and a phospho-silicate glass film.

In FIG. 1, a substrate backbias voltage generating circuit Vbb-G generates a negative backbias voltage Vbb to be fed to a semiconductor substrate, in response to a positive supply voltage such as +5 V to be applied between the supply voltage Vcc and a reference potential or earth terminal Vss, which construct the external terminals of an integrated circuit. As a result, the backbias is applied to the substrate gate of the N-channel MOSFETs to reduce the parasitic capacity between the source-drain and substrate of the N-channel MOSFETs so that the operation of the circuit is speeded up.

The memory array M-ARY is constructed with the two-intersection type or the folded bit (or data) line type, although not especially limited thereto. Paired lines are specifically shown in FIG. 1. To a pair of parallel-arranged complementary data lines D and $\overline{D}$, there are arranged and coupled with a predetermined regularity, as shown in the same Figure, the respective input and output nodes of a plurality of memory cells each of which is constructed of the address selecting MOSFET Qm and the information storing capacitor Cs.

A precharge circuit PC1 is constructed of a switching MOSFET connected between the complementary data lines D and $\overline{D}$, as is represented by a MOSFET Q5.

A sense amplifier SA is constructed of a CMOS latch circuit, which is composed of P-channel MOSFETs Q7 and Q9 and N-channel MOSFETs Q6 and Q8, as shown as representatives, and has its paired input and output nodes coupled to the complementary data lines D and $\overline{D}$. The latch circuit is fed with the supply voltage Vcc through P-channel MOSFETS Q12 and Q13 in the parallel mode and with the earth voltage Vss of the circuit through N-channel MOSFETs Q10 and Q11, although the invention is not especially limited to this configuration. These power switching MOSFETs Q10 and Q11 and MOSFETa Q12 and Q13 are used commonly with the latch circuits which are disposed in other similar rows of the same memory mat. In other words, the P-channel MOSFETs and N-channel MOSFETs of the latch circuit in the same memory mat have their respective sources connected commonly The MOSFETs Q10 and Q12 are made to have relatively small conductances, when they are turned ON, respectively, and are adapted to have their gates fed with complementary timing pulses $\phi$pa1 and $\overline{\phi}$pa1 for activating the sense amplifier SA in the operation cycle. The MOSFETs Q11 and Q13 are made to have relatively large conductances, when they are turned ON, and are adapted to have their gates fed with complementary timing pulses $\phi$pa2 and $\overline{\phi}$pa2 which are delayed from the timing pulses $\phi$pa1 and $\overline{\phi}$pa1. Thus, the sense amplifier SA has its operation divided into two steps. When the timing pulses $\phi$pa1 and $\overline{\phi}$pa1 are generated, i.e., at the first step, the minute read voltage applied between the paired data lines from the memory cell is amplified without any undesirable level fluctuation by the current limiting operations of the MOSFETs Q10 and Q12 having relatively small conductances. When the timing pulses $\phi$pa2 and $\overline{\phi}$pa2 are generated after the difference in the potential between the complementary data lines has been enlarged by the amplifying operation of the sense amplifier SA, i.e., when the second step is entered, the MOSFETs Q11 and Q13 having the relatively large conductances are turned ON. The amplifying operation of the sense amplifier SA is strengthened by turning ON the MOSFETs Q11 and Q13. Thus, by causing the sense amplifier SA to conduct its amplifying operation in the two steps, it is possible to read the data at a high speed while preventing the undesirable level changes of the complementary data lines.

A row decoder R-RCR is constructed of a combination of two divided row decoder R-DCR1 and R-DCR2, although the invention is not specifically limited to this configuration.

The second row decoder R-DCR2 is constructed of a plurality of unit decoders. Each of these unit decoder is made to correspond to four word lines. In order to avoid the complexity of FIG. 1, the second row decoder R-DCR2 is shown as a representative for one circuit (corresponding to four word lines). According to the construction, as shown, a NAND circuit having a CMOS structure is constructed of N-channel MOSFETs Q32 to Q36 and P-channel MOSFETs Q37 to Q41 made receptive to address signals $\overline{a}$2 to $\overline{a}$6 to generate a word line selection signal shared among the four word lines W0 to W3. The output of the NAND circuit is inverted by a CMOS inverter IV1 and is transmitted through cut MOSFETs Q28 to Q31 to the gates of transmission gate MOSFETs Q24 to Q27 acting as the switching circuit. The cutting MOSFETs Q28 to Q31 are automatically turned OFF by the bootstrap voltages which are applied through the gate-channel capacities of the transmission gate MOSFETs Q24 to Q26 corresponding thereto, respectively. In other words, the cutting MOSFETs enable the gate potentials to rise by the bootstrap action of the transmission gate MOSFETs. As a result, the individual transmission gate MOSFETs are enabled to have sufficiently low ON resistances, when they are to be turned ON, thereby to transmit selection signals at high levels.

The first row decoder R-DCR1 is constructed, although its specific circuit is not shown, of: a decoder for decoding 2-bit complementary address signals a0 and $\bar{a}0$, and a1 and $\bar{a}1$ to generate four kinds of decoded signals; and a switching circuit for distributing a word line selection timing signal $\phi x$ in accordance with the output of that decoder. The aforementioned switching circuit is composed, for example, of four cutting MOSFETs for transmitting the above-specified four kinds of decoded signals, respectively, and four transmission MOSFETs to be switched by the decoded signals fed through the cutting MOSFETs, respectively. Each of the transmission gate MOSFETs transmits the word line selection timing signal $\phi x$ when it turned ON. This generates four word line selection timing signals $\phi x00$ to $\phi x11$ which are synchronized with the word line selection timing signal $\phi x$. These word line selection timing signals $\phi x00$ to $\phi x11$ are transmitted to the respective word lines through the transmission gate MOSFETs Q24 to Q27.

Although the invention is not specifically limited to this configuration, the timing signal $\phi x00$ is raised to the high level in synchronism with the timing signal $\phi x$ when the address signals a0 and a1 are at the low level. Likewise, the timing signals $\phi x01$, $\phi x10$ and $\phi x11$ are raised to the high level in response to the timing signal $\phi x$ when the address signals $\bar{a}0$ and a1, a0 and $\bar{a}1$, and $\bar{a}0$ and $\bar{a}1$ are set at the low level, respectively.

When the timing signals $\phi x00$ to $\phi x11$ are outputted in accordance with the combination of the address signal a0 and a1, as described above, the address signals a1 and $\bar{a}1$ are deemed as a kind of word line group discriminating signal for discriminating a group of word lines (i.e., W0 and W1, which will be referred to a "first word line group") corresponding to the memory cells coupled to the data line D and a group of word lines (i.e., W2 and W3, which will be referred to as a "second word line group") corresponding to the memory 5 cells coupled to the data line $\bar{D}$ from the plural word lines.

By dividing the row decoder R-DCR into the two row decoders R-DCR1 and R-DCR2, the row decoder R-DCR2 is enabled to have its pitch (or interval) matching that of the word line. As a result, no useless space is established on the semiconductor substrate.

Between the word lines and ground potential, respectively, there are connected MOSFETs Q20 to Q23. These MOSFETs Q20 to Q23 are caused to fix the unselected word lines at the earth potential by having their gates fed with the output of the aforementioned NAND circuit. Although not especially limited, the aforementioned word lines are equipped with the reset MOSFETs Q1 to Q4 at their distant ends (i.e., at the ends opposed to the decoder side). The word lines set in advance at the selection level are reset at the earth level from their two ends when they are turned ON in response to a reset pulse $\phi pw$. Incidentally, the 2-bit address signals a7 and a8 of the row system are used as a switching (or selecting) signal for a mat (i.e., the memory arrays divided into a plurality and resembling the aforementioned ones).

In response to address signals fed from external terminals A0 to A8, a row address buffer X-ADB generates address signals $\bar{a}0$ to $\bar{a}8$ in the phase opposed to that of the internal address signals a0 to a8 in phase with the address signals fed from the external terminals (both the address signals a0 to a8 and $\bar{a}$ to $\bar{a}$ will be designated altogether at a0 to a8). These internal address signals a0 to a8 are fed through a later-described multiplexer MPX to the row decoder R-DCR.

A column switch C-SW is constructed such MOSFETs connected between the complementary data lines D and $\bar{D}$ and common complementary data lines CD and $\overline{CD}$ as are represented by MOSFETs Q42 and Q43. These MOSFETs are fed with a selection signal from a column decoder C-DCR.

A column decoder C-DCR decodes address signals $\bar{a}9$ to $\bar{a}14$ in phase opposed to internal address signals a9 to a14 fed from a column address buffer Y-ADB and outputs a selection signal to be fed to the column switch C-SW at a column selecting timing determined by a data line selecting timing signal $\phi y$.

In response to address signals fed from external terminals A9 to A14, the column address buffer Y-ADB generates both the internal address signals a9 to a14 in phase with the address signals fed from the external terminals and the address signals $\bar{a}9$ to $\bar{a}14$ in phase with the same (both the address signals will be designated altogether at a9 to a14), thereby to feed them to the column decoder C-DCR.

Between the common complementary data lines CD and $\overline{CD}$, there is connected a precharge MOSFET Q44 which constructs a precharge circuit similar to the precharge circuit pc1. To these common complementary data lines CD and $\overline{CD}$, there are coupled a pair of input and output nodes of a main amplifier MA which has a circuit construction similar to that of the sense amplifier SA.

In a read operation, a data output buffer DOB is brought into its operative state in response to a timing signal $\bar{\phi}rw$ fed thereto, to amplify and send the output signal of the main amplifier MA out of an external terminal I/0. In a write operation, the output of the data output buffer DOB is brought into its high impedance state by the timing signal $\bar{\phi}$ rw.

In the writing operation, a data input buffer DIB is brought into its operative state by a timing signal $\phi rw$ fed thereto thereby to transmit a complementary write signal according to the write signal fed from the external terminal I/0 to the common complementary data lines CD and $\overline{CD}$. This causes the selected memory cell to conduct a write operation. In a read operation, the outputs of the data input buffer DIB are brought into its high impedance state by the timing signal $\phi rw$.

In a write operation into the dynamic memory cell composed of the address selecting MOSFET Qm and the information storing capacitor Cs, in order to effect a full write in the information storing capacitor Cs, i.e., in order to prevent the level loss of the writing high level into the information storing capacitor Cs by the threshold voltage of the address selecting MOSFET Qm or the like, there is provided a word line bootstrap circuit (not shown) which is to be started by the word line selecting timing signal $\phi x$. In response to both the word line selecting timing signal $\phi x$ and its delayed signal, that word line bootstrap circuit raises the high level of the word line selecting timing signal $\phi x$ to a level higher than the supply voltage Vcc.

The various timing signals thus far described are generated by the following respective circuit blocks.

The circuit indicated at circuit symbol ATD is an address signal change detecting circuit which is made responsive to the address signals a0 to a8 (or $\bar{a}0$ to $\bar{a}8$) and the address signals a9 to a14 (or $\bar{a}9$ to $\bar{a}14$) to detect the rising or breaking change in those address signals. The address signal change detecting circuit ATD is constructed, although the invention is not especially limited to this configuration, of: exclusive OR circuits made responsive to the address signals a0 to a8 and their delayed signal, respectively; an OR circuit made responsive to the output signals of those exclusive OR circuits; and a similar circuit made responsive to the address signals a9 to a14. In other words, the exclusive circuits are provided for the respective address signals which are made responsive to the address signals and their delayed signals. If any one of the address signals a0 to a8 changes, a row address signal change detecting pulse $\phi r$ synchronized with that changing timing is detected by the address signal change detecting circuit ATD. Likewise, if any one of the address signals a9 to a14 changes, there is generated a column address signal change detecting pulse $\phi c$.

Indicated at circuit symbol TG is a timing generating circuit for generating the major timing signals and so on, as represented above. More specifically, this timing generating circuit TG is made responsive to not only the address signal change detecting pulses $\phi r$ and $\phi c$ but also a write enable signal $\overline{WE}$ and a chip selecting signal $\overline{CS}$ fed from external terminals to generate the aforementioned series timing pulses.

Indicated at circuit symbol REF is an automatic refresh circuit which includes a fresh address counter, a timer and so on, although not shown. This automatic refresh circuit REF has its operation controlled by a refresh signal $\overline{RESH}$ coming from an external terminal. If the refresh signal $\overline{RESH}$ is dropped to the low level when the chip selecting signal $\overline{CS}$ is at the high level, i.e., at the chip non-selecting level, the automatic refresh circuit REF is accordingly brought into its operative state.

The refreshing operations of the memory when the automatic refresh circuit REF is brought into its operative state are as follows.

Specifically, the circuit REF outputs such a control signal $\phi$ref to the multiplexer MPX as will effect transmission of the internal address signal from the built-in refresh address counter to the row decoder R-DCR. When the output of the multiplexer is changed to the internal address signal indicating the refresh address, the detecting pulse $\phi r$ is outputted from the address signal change detecting circuit ATD. When the detecting pulse $\phi r$ is generated, the various row timing signals are sequentially generated. Specifically, the word line selecting signal $\phi x$ is dropped to the low level, and the word line resetting timing signal $\phi pw$ is raised to a high level for a predetermined period to turn ON the MOSFETs Q1, Q2 and so on. The timing signals $\phi pa1$, $\phi pa2$ and so on for the sense amplifier are set at the level to turn OFF the MOSFETs Q10 to Q13. A timing signal $\phi cpw$ is raised to the high level for a predetermined period to operate the precharge circuit PC1 in synchronism with the end of the reset of the word lines. In synchronism with the end of the operation of the precharge circuit PC1, the word line selecting timing signal $\phi x$ is raised to the high level. After one word line corresponding to the internal address signal indicating the refresh address has been selected, the timing signals $\phi pa1$, $\phi pa2$ and so on are set at the level to operate the sense amplifier SA. As a result, the refreshing (i.e., auto-refreshing) operation of the memory cell coupled to the one word line corresponding to the internal address signal is executed.

Although not especially limited, if the refresh signal $\overline{RESH}$ is continuously left at the low level, the timer is accordingly operated to increment the refresh address counter at a predetermined interval. This effects continuous refreshing (i.e., autorefreshing) operation.

In the embodiment under discussion, in order to enlarge the level margin of the signal read from the memory cell, i.e., in order to relatively reduce the coupling noises given to the data line through the address selecting MOSFET Qm of the memory cell selected, there are provided dummy MOSFETs Q50 and Q51. These dummy MOSFETs Q50 and Q51 have their drains or sources coupled to the paired complementary data lines $\bar{D}$ and D, respectively, and their other electrodes, i.e., sources or drains left in their floating states, i.e., in the states where they are not coupled to other elements. It should be understood in this case that a parasitic capacity is present between the other sources or drains and the earth potential point of the circuit. The gate of the dummy MOSFET Q50 is coupled to a dummy word line $\overline{DW}$, whereas the gate of the dummy MOSFET Q51 is coupled to a dummy word line DW.

The dummy word line $\overline{DW}$ is switched from the low level to the high level synchronously as the memory cell coupled to the one data line $\bar{D}$ is brought into its selected state. The dummy word line DW is switched from the low level to the high level synchronously as the memory cell coupled to the other data line D is brought into its selected state. Although the invention is not especially limited to this configuration, the dummy word lines DW and $\overline{DW}$ have their high level substantially equal to the supply voltage Vcc of the circuit and their low level substantially equal to the ground potential of the circuit.

The dummy MOSFETs Q50 and Q51 are considered to have such a construction that the noise to be imparted therethrough to one data line and the noise to be imparted therethrough to the other data line through the address selecting MOSFET of the memory cell selected may be substantially equal. In this case, the level of the noise imparted to the data lines is also affected by the amplitude level of the signals imparted to the dummy data lines DW and $\overline{DW}$.

Although the invention is not especially limited to this configuration, each of the dummy MOSFETs Q50 and Q51 is set in a depletion mode so that it may be held substantially in its ON state irrespective of the level of the dummy word lines DW and $\overline{DW}$. This mode setting of the dummy MOSFETs is effective to prevent the following circuit operations.

If the dummy MOSFETs Q50 and Q51 are in an enhancement mode and if a relatively high parasitic capacity is present in the source or drain electrodes left uncoupled to the data lines D and $\bar{D}$, the potential fluctuations imparted to the data lines $\bar{D}$ and D by the dummy MOSFETs Q50 and Q51 are affected by the parasitic capacities of the dummy MOSFETs Q50 and Q51. For example, if the parasitic capacity of the dummy MOSFET Q50 is charged in advance with a potential substantially at 0 v, the data line $\overline{D}$ has the following level. When the dummy MOSFET Q50 is turned ON, a charge redistribution is accordingly caused between the data line $\overline{D}$ and the parasitic capacity of the MOSFET Q50. As a result, the level of the data line $\overline{D}$ is slightly dropped. Conversely, if the parasitic capacity of the dummy MOSFET Q50 is charged with a level substantially equal to the supply voltage, the level of the data line $\overline{D}$ is slightly raised by turning ON the dummy MOSFET Q50.

If the dummy MOSFETs Q50 and Q51 are in the depletion mode, their parasitic capacities are charged to levels substantially equal to those of the data lines $\overline{D}$ and D, respectively. Therefore, the parasitic capacities of the dummy MOSFETs Q50 and Q51 would exert no substantial influence upon the level fluctuations to be imparted to the data lines $\overline{D}$ and D even if they were relatively high. In accordance with the present embodiment, either the respective gate areas of the dummy MOSFETs Q50 and Q51 or the areas of the channel forming regions are so set that the noise imparted to one of the paired data from the address selecting MOSFET Qm of the memory cell selected may be equal to the coupling noises imparted to the other of the paired data lines by the dummy MOSFET Q50 or Q51.

If the dummy word line DW or $\overline{DW}$ has its low level set at ground potential and its high level set at the supply voltage Vcc, as described above, the size (or the gate area) of the MOSFET Q50 or Q51 is set substantially at one half of the address selecting MOSFET Qm, considering the following point.

In the half precharge system, the precharge level of the data lines is set at Vcc/2. If the level Vcc is stored in the storing capacitor Cs in the memory cell to be selected, the potential of the data lines is raised slightly with respect to the precharge level by selecting that memory cell. Likewise, if the level of 0 V is stored in the storing capacitor Cs, the potential of the data lines is slightly reduced by selecting that particular memory cell. In this case, the potential change given to the data lines by the selected memory cell is made small by reducing the ratio Cs/Co of the storage capacity Cs to the data line capacity Co. Therefore, the data lines can be deemed to be set substantially at the level of Vcc/2. In accordance with this, the address selecting MOSFET Qm can be deemed to be switched in the state where its source and drain are set substantially at Vcc/2. In other words, the address selecting MOSFET can be deemed to have a channel region induced in the channel forming region below the its gate electrode thereby to have a relative large gate capacity, if it is raised to a level higher than its gate voltage (i.e., Vcc/2) + Vth (wherein Vth is the threshold voltage of the MOSFET Qm). The word line is fed with the bootstrap voltage so that it is raised to a potential slightly higher than Vcc+Vth. It follows that the potential changes given to the data lines through the gate capacity of the address selecting MOSFET, i.e., the noise, can be deemed to be substantially equal to that resulting from the gate potential change at the level of about Vcc/2 when the word line is selected.

The respective dummy MOSFETs Q50 and Q51 in the depletion mode are held substantially in their ON states even if the dummy word lines $\overline{DW}$ and DW are held in the low level, if their threshold voltages are sufficiently high. In accordance with this, the noise imparted through the gate capacities of the dummy MOSFETs Q50 and Q51 to the respectively corresponding responding data lines $\overline{D}$ and D can be deemed to be equal to that caused by the whole of the level range of the signal given to the gates of those dummy MOSFETs rather than by a portion thereof. If the signal level of the dummy word line $\overline{DW}$ (or DW) is changed from 0 V to Vcc, therefore, the value of the coupling capacity established by the dummy MOSFETs Q50 and Q51 is desirably set at about one half as large as that of the address selecting MOSFET Qm. In the present embodiment, the gate insulating films of the address selecting MOSFET Qm and the dummy MOSFETs Q50 and Q51 are formed simultaneously with each other according to the technique of fabricating the semiconductor integrated circuit device. It follows that the gate capacities of those two MOSFETs per unit area are substantially equal to each other. In order to achieve the aforementioned half gate capacity, therefore, the gate areas of the dummy MOSFETs are made about one half as large as that of the address selecting MOSFET.

Incidentally, to each of the dummy MOSFETs Q50 and Q51, there can be coupled a capacity element which acts as one kind of dummy capacity having a construction similar to that of the capacity Cs of the memory cell. In this case, however, the following point has to be taken into consideration. Specifically, if the dummy MOSFETs Q50 and Q51 are set in the depletion mode, as in the embodiment, the dummy capacity is coupled through the dummy MOSFET Q50 or Q51 to the data line $\overline{D}$ or D so that it forms part of the data line capacity of the data line $\overline{D}$ or D. In other words, the data line capacity is increased by the dummy capacity. As a result, the signal amplitude to be given to the data line $\overline{D}$ or D is reduced by the memory cell selected. If no dummy capacity is provided, as in the embodiment, it is possible to augment the data line capacities.

In case the signal amplitude required for the dummy word lines $\overline{DW}$ and DW may be substantially equal to the supply voltage Vcc, as in the embodiment, a dummy word line driving circuit DDC may be made to have a relatively simple construction. In this case, the dummy word line driving circuit DDC is constructed, although not shown in detail, of: a first unit circuit composed of a CMOS NAND circuit made receptive of the timing signal φx and the address signal a1, for example, as its input signals, and a CMOS inverter acting as a buffer circuit made receptive of the output of the CMOS NAND circuit; and a second unit circuit composed of a CMOS NAND circuit made likewise receptive of the timing signal φx and the address signal a1, and a CMOS inverter. These first and second unit circuits are individually operated by the supply voltage Vcc. The output of the first unit circuit is fed to the dummy word line $\overline{DW}$ whereas the output of the second unit circuit is fed to the dummy word line DW.

In case the dummy word line driving circuit DDC is constructed as above, the timing at which one of the word lines is set at the high level can be made satisfactorily coincident with the timing at which one of the dummy word lines is set at the high level.

The present embodiment can be modified such that the signal amplitude given to the dummy word line $\overline{DW}$ (or DW) is set at Vcc/2. In this modification, the dummy MOSFETs Q50 and Q51 and the address selecting MOSFET Qm may be made to have an equal size. In this case, however, note that the circuit is slightly more complicated than the case in which the signals applied to the dummy word line $\overline{DW}$ and DW are allowed to take a level ranging from 0 V to Vcc. For setting the signal amplitude at Vcc/2, a special circuit is required, such as a power supply circuit or a voltage dividing circuit which is operative to generate a voltage at a level of Vcc/2 in response to the supply voltage Vcc.

Figure 2:
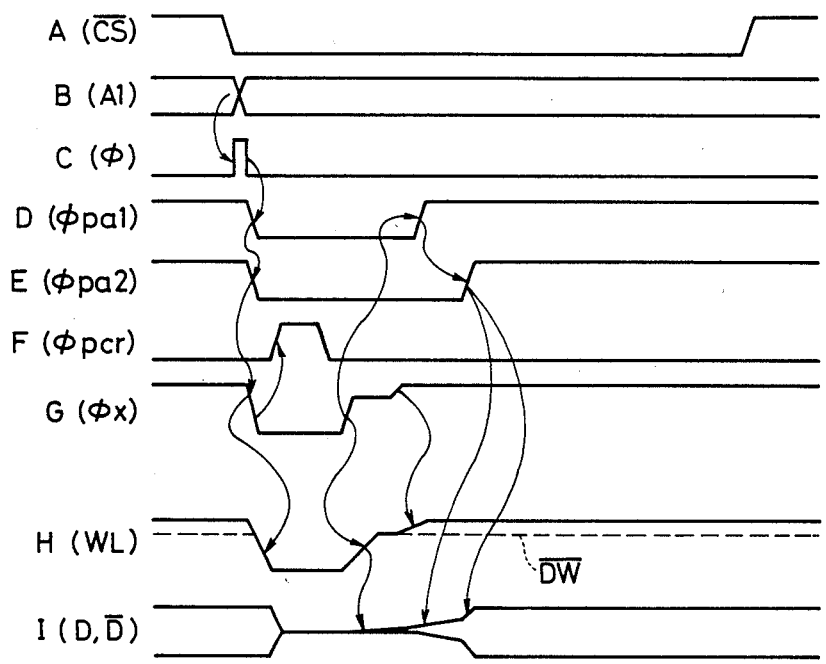
FIG. 2 is a timing chart for explaining the operations of the embodiment.

Next, the operations of the circuit of the present invention will be described in the following with reference to the timing chart shown in FIG. 2.

When any one of address signals Ai fed from external terminals is so changed as shown in FIG. 2B with the chip selecting signal $\overline{CS}$ being in the chip selecting state at the low level, the address signal change detecting pulses $\phi r$ and $\phi c$ are accordingly generated, as shown in FIG. 2C, from the address signal change detecting circuit ATD.

In synchronism with these address signal change detecting pulses $\phi r$ and $\phi c$, the timing generating circuit TG once resets a selecting circuit for selecting a memory array M-ARY. By the changes of the timing pulses $\phi pa1$ and $\phi pa2$ (or $\overline{\phi pa1}$ and $\overline{\phi pa2}$) to the low (or high) level, as shown in FIGS. 2D and 2E, more specifically, the sense amplifier SA is brought into its inoperative state so that the complementary data lines D and $\overline{D}$ are set to the high and low levels in the floating state according to the previous read or write information. As shown in FIG. 2G, moreover, the word line selecting timing signal $\phi x$ and the data line selecting signal $\phi y$ (although not shown) are set at the unselected levels at the low level, respectively. After this, a precharge pulse $\phi pcr$ is once set at the high level, as shown in FIG. 2F, so that the complementary data lines are short-circuited to each other. As a result, the half precharge operation is conducted. After the end of this precharge operation, the word line selecting timing signal $\phi x$ is set at the high level. As a result, one word line corresponding to the address signal taken in is selected. If, at this time, the memory cell coupled to the one complementary data line D is selected, the dummy word line $\overline{DW}$ coupled to the gate of the dummy MOSFET Q50 disposed at the other complementary data line $\overline{D}$ is raised to the level Vcc from ground potential, as indicated by a broken line of the same Figure. As a result, there appear on the complementary data lines D and $\overline{D}$, coupling noises which are made in phase by the address selecting MOSFET Qm of the memory cell and the dummy MOSFET. These in-phase noises are neglected by the differential sense amplifier SA.

Next, the sense amplifier SA is brought into its operative state, by setting the timing pulses $\phi pa1$ and $\phi pa2$ at the high (and low) levels, to amplify the stored information of the memory cell stored to the complementary data lines D and $\overline{D}$, as shown in FIG. 2I. The charges as that stored information of the memory cell, which is to be temporarily interrupted by the aforementioned word line selecting operation, is restored by receiving the amplified levels of the complementary data lines D and $\overline{D}$ as they are.

Next, the data line selecting timing signal $\phi y$ is set at the high level so that the selection signal is outputted from the column decoder C-DCR. When this selection signal is fed to the column switch C-SW, the paired data lines D and $\overline{D}$ and the common complementary data lines CD and $\overline{CD}$ are coupled. As a result, there appear on the common complementary data lines CD and $\overline{CD}$ the data according to the levels of the coupled data lines D and D. If in the reading operation, the read signals read out to the common complementary data lines CD and $\overline{CD}$ are amplified by the main amplifier MA. When the timing pulse $\phi rw$ is set at the high level, the data output buffer DOB is rendered operative. As a result, the read output Dout is sent out from the external terminal I/0. If in the writing operation, the timing pulse $\phi rw$ is set at the high level so that the data input buffer DIB is rendered operative. The complementary write signals at the high and low levels, which are outputted from the data input buffer IDB, are written in the memory cells through the 20 common complementary data lines CD and $\overline{CD}$, the column switching MOSFETs Q42 and Q43 and the complementary data lines D and $\overline{D}$ (although not shown).

Embodiment 2

Figure 3:
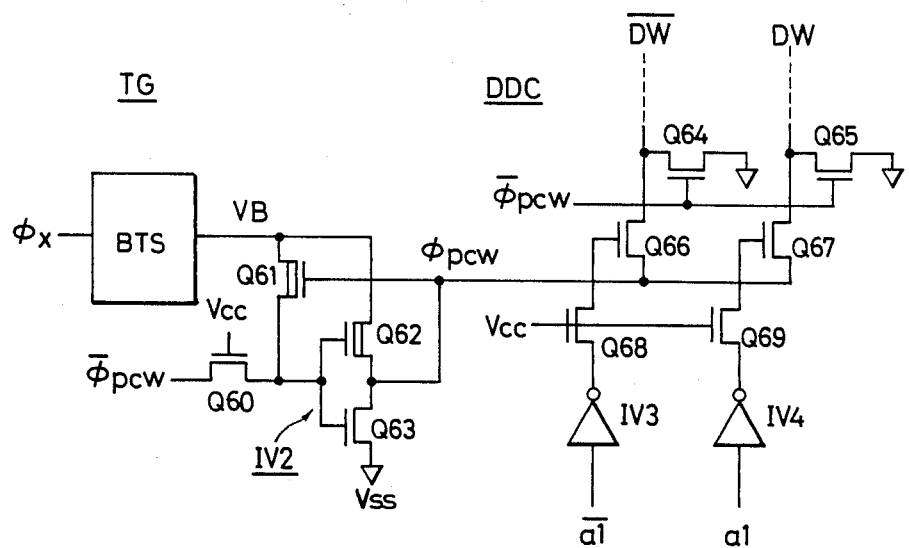
FIG. 3 is a circuit diagram showing another embodiment of the present invention.

FIG. 3 is a circuit diagram showing portions of the dummy word line driving circuit DDC and the timing generating circuit TG according to another embodiment of the present invention. The circuit DDC of this embodiment can be replaced by the circuit DDC of FIG. 1. In case the circuit of this embodiment is used, reset MOSFETs Q14 and Q15 coupled to the dummy word lines $\overline{DW}$ and DW in FIG. 1 are replaced by MOSFETs Q64 and Q65 of FIG. 3.

The word line driving circuit DDC is constructed of CMOS inverters IV3 and IV4, cut MOSFETs Q68 and Q69, transfer MOSFETs Q66 and Q67 and the MOSFETs Q64 and Q65.

The timing generating circuit TG includes a bootstrap circuit BTS and an inverter circuit IV2.

The bootstrap circuit BTS includes a driving circuit which is not shown, a delay circuit and a bootstrap capacitor. When the timing signal $\phi x$ is set at the low level, as shown in FIG. 2G, the bootstrap capacitor in the circuit BTS has its one electrode supplied accordingly with a charge voltage from its inner driving circuit. The other electrode of the bootstrap capacitor is fed with the output of the delay circuit made receptive of the output of the aforementioned driving circuit. The one electrode of the bootstrap capacitor is coupled to the output terminal of the circuit BTS. As a result, when the timing signal $\phi x$ is set at the low level, the output VB of the circuit BTS is accordingly raised to a high level exceeding the level of the supply voltage Vcc.

the inverter IV2 receives the output voltage VBH of the bootstrap circuit as its operating voltage. This inverter IV2 includes not only a P-channel MOSFET Q62 and an N-channel MOSFET Q63, as shown, but also a cut MOSFET Q60 and a positive feedback MOSFET Q61. A timing signal $\overline{\phi pcw}$ fed to the inverter IV2 has its phase opposed substantially to that of the timing signal $\phi x$. FIG. 4A shows the waveform of the timing signal $\phi pcw$ which is generated by the inverter IV2.

As a result that the operating voltage of the inverter IV2 is fed from the bootstrap BTS, the timing signal $\phi pcw$ takes a high level exceeding the supply voltage Vcc like that of the timing signal $\phi x$. Incidentally, the MOSFETs Q60 and Q61 are required when the high level of the timing signal $\phi pcw$ fails to rise substantially up to the supply voltage Vcc. Those MOSFETs Q60 and Q61 may be dispensed with if the high level of the timing signal $\phi pcw$ is substantially equal to that of the voltage VB.

Figure 4:
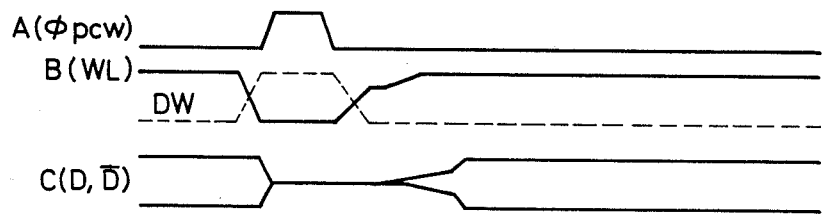
FIG. 4 is a timing chart showing the operations of the another embodiment.

The signals outputted from the dummy word line driving circuit DDC of FIG. 3 are so set as are shown in the timing chart of FIG. 4.

Now, when the memory cell disposed on the data line D shown in FIG. 1 is to be selected, the address signal $\bar{a}1$ is at the high level so that the output of the inverter IV4 acting as the buffer circuit is accordingly set at the high level. This high level output is fed through the cut MOSFET Q69 to the gate of the transfer MOSFET Q67. Therefore, when the precharge pulse $\phi$pcw is set at the high level, as shown in FIG. 4A, prior to the selecting operation of the memory cell, the dummy word line DW is accordingly precharged to the high level. Thus, the dummy MOSFET Q51 shown in FIG. 1 is turned ON so that its source and drain in the floating state are made equal to the precharge level of the complementary data lines. As a result, on the data line D to which the memory cell selected is coupled, there arise both positive coupling noise coming through the address selecting MOSFET Qm in accordance with the rise of the word line and negative coupling noise coming through the dummy MOSFET Q51 (or Q50) in accordance with the breakdown of the dummy word line DW (or $\overline{DW}$). Since those two coupling noise components are in phases opposed to each other, the undesirable level change appearing on the data line D is offset substantially to 0.

At this time, the transfer MOSFET Q66 is turned OFF because its gate is set at a low level substantially equal to 0 V by the inverter IV3. Therefore, the dummy data line $\overline{DW}$ is held at the low level even if the timing signal $\phi$pcw is raised to the high level.

When the memory cell coupled to the data line $\overline{D}$, the opposite of the above operation, the timing signal $\phi$pcw is applied to the dummy word line $\overline{DW}$ through the MOSFET Q66.

The MOSFETs Q64 and Q65 are turned ON by setting the timing signal $\phi$pcw at the high level. As a result, the dummy word lines $\overline{DW}$ and DW are reset at the low level.

In this second embodiment, incidentally, if a dummy capacity is coupled to the dummy MOSFETs Q50 and Q51 (as shown in FIG. 1) in the depletion mode, the amplitude level of the signals to be given to the data lines $\overline{D}$ and D (as shown in FIG. 1) is reduced, as in the first embodiment.

In the second embodiment, the dummy MOSFETs Q50 and Q51 shown in FIG. 1 may be changed to the enhancement type. In this case, in order to make it possible to offset noise satisfactorily, the MOSFETs Q50 and Q51 may be made to have the same gate area as the gate (i.e., the channel forming area) area of the MOSFET Qm in the memory cell. Ideally, these MOSFETs should have the same extending direction of the channel region as that of the MOSFET Qm and the same channel length and width as those of the MOSFET Qm so that their capacity dispersion due to the mask displacement when the integrated circuit is to be fabricated may become coincident with that of the MOSFET Qm.

The following effects can be attained according to the present invention.

(1) by providing the dummy MOSFETs in the half precharge type dynamic RAM, it is possible to relatively reduce the coupling noise which might otherwise be imparted to the data lines through the address selecting MOSFET of the memory cell. As a result, the undesirable level change of the data lines can be reduced so that the operation level margin can be enlarged.

(2) Since the level margin can be enlarged by the above effect (1), the elements can be made so fine that a number of memory cells can be formed on the data lines so that a dynamic RAM having a capacity as large as 1 Mbit can be realized.

(3) Since each data line is equipped with only one dummy MOSFET, enlargement of the operation margin and large memory capacity can be realized by that remarkably simple construction.

Although the invention conceived by us has been specifically described hereinbefore in connection with the embodiments thereof, it is not be limited thereto but can naturally be modified in various manners within the scope of the gist. For example, the high level of the dummy word line and the size of the dummy MOSFETs may be so set as to relatively reduce the coupling noise appearing through the aforementioned address selecting MOSFET Qm substantially to 0 with reference to the 0 V of the level stored in the storing capacitor Cs of the memory cell. Alternatively, the high level of the aforementioned dummy word line and the size of the dummy MOSFET may be so set as to establish the intermediate coupling noise between the two coupling noise components which will appear through the aforementioned address selecting MOSFET Qm in cases the high and low levels are stored in the storing capacitor Cs. The dummy MOSFETs may desirably have a gate structure similar to that of the address selecting MOSFET of the memory cell. The dummy MOSFETs may be made to have substantially the same construction as that of the MOS capacitor, i.e., the construction in which one of its current carrying electrodes such as its source and drains is omitted. If necessary, the capacity element may be so modified as to have one plate electrode formed on the semiconductor substrate and the other plate electrode formed thereon through an insulating film. The remaining specific circuits constructing the aforementioned dynamic RAM can take a variety of specific practical modes of construction. For example, the address signal may be multiplexed and fed in synchronism with address strobe signals $\overline{RAS}$ and $\overline{CAS}$ from the common address terminal. The automatic refresh circuit is not absolutely indispensable.

The present invention can be utilized widely in the half precharge type dynamic RAM.

What is claimed is:

1. A semiconductor memory comprising:
    a reference potential generating circuit;
    a first data line adapted to be supplied with a reference potential from said reference potential generating circuit;
    a second data line paired with said first data line and adapted to be supplied with said reference potential from said reference potential generating circuit;
    a word line adapted to be fed with a selection signal;
    a dummy word line adapted to be fed with a drive signal which is synchronized with said selection signal;
    a dynamic memory cell coupled to said word line and to said first data line, and including an address selecting MOSFET and an information storing capacitor, wherein said dynamic memory cell sets the potential of said first data line at a higher or lower level than the reference potential at said second data line when said dynamic memory cell is selected by said selection signal being fed to said word line;

a sense amplifier for amplifying a level difference which occurs between said first data line and said second data line when said dynamic memory cell is selected; and a dummy capacitor which is coupled between one of said second or first data lines and said dummy word line and which imparts noise to said one of said second or first data line in response to said drive signal being fed to said dummy word line to reduce noise between said first and second data lines which is caused by operation of said address selecting MOSFET when said dynamic memory cell is selected.

wherein said dummy capacitor comprises a MOS capacitor, wherein said MOS capacitor comprises a MOSFET having a gate electrode coupled to said dummy word line and a current carrying electrode coupled to said second or first data line, and wherein the MOSFET acting as said MOS capacitor is a depletion mode MOSFET.

2. A semiconductor memory according to claim 4, wherein said dummy capacitor is connected between said dummy word line and said second data line, and wherein said drive signal is raised to a high level in synchronism with a rise of said selection signal to a high level.

3. A semiconductor memory comprising:

a reference potential generating circuit;

a first data line adapted to be supplied with a reference potential from said reference potential generating circuit;

a second data line paired with said first data line and adapted to be supplied with said reference potential from said reference potential generating circuit;

a word line adapted to be fed with a selection signal;

a dummy word line adapted to be fed with a drive signal which is synchronized with said selection signal;

a dynamic memory cell coupled to said word line and to said first data line, and including an address selecting MOSFET and an information storing capacitor, wherein said dynamic memory cell sets the potential of said first data line at a higher or lower level than the reference potential at said second data line when said dynamic memory cell is selected by said selection signal being fed to said word line;

a sense amplifier for amplifying a level difference which occurs between said first data line and said second data line when said dynamic memory cell is selected; and a dummy capacitor which is coupled between one of said second or first data lines and said dummy word line and which imparts noise to said one of said second or first data line in response to said drive signal being fed to said dummy word line to reduce noise between said first and second data line which is caused by operation of said address selecting MOSFET when said dynamic memory cell is selected;

wherein said dummy capacitor comprises a MOS capacitor, wherein said dummy capacitor is connected between said dummy word line and said second data line, wherein said drive signal is raised to a high level in synchronism with a rise of said selection signal to a high level, and wherein said reference potential generating circuit includes a switching element for short-circuiting said first and second data lines to generate said reference potential.

4. A semiconductor memory according to claim 3, wherein said first and second data lines have data line capacitances substantially equal to each other; and wherein said dummy capacitor element capacitance has less than a gate capacitance of said address selecting MOSFET in an ON state.

5. A semiconductor memory according to claim 3, wherein said dummy capacitor includes a MOSFET having a gate electrode coupled to said dummy word line and a current transfer electrode coupled to said second data line.

6. A semiconductor memory according to claim 5, wherein the MOSFET acting as said dummy capacitor is a depletion mode MOSFET and has less gate capacitance than a gate capacitance of said address selecting MOSFET in an ON state.

7. A semiconductor memory according to claim 5, wherein said address selecting MOSFET and said MOSFET acting as said dummy capacitor each have gate electrodes occupying predetermined areas on a major surface of a semiconductor body on which said semiconductor memory is formed, and further wherein the MOSFET acting as said dummy capacitor is a depletion mode MOSFET and has a smaller gate electrode area than the gate electrode area of said address selecting MOSFET.

8. A semiconductor memory according to claim 7, wherein the gate electrode area of the MOSFET acting as said dummy capacitive element is half as large as the gate electrode area of said address selecting MOSFET.

9. A semiconductor memory according to claim 7, wherein said first and second data lines constitute together the data line of one memory array.

10. A semiconductor memory according to claim 1, wherein said dummy capacitive element is connected between said dummy word line and said first data line, and wherein said drive signal is charged to a predetermined level from a high level in synchronism with the rise of said selection signal to a high level.

11. A semiconductor memory comprising:

a reference potential generating circuit;

a first data line adapted to be supplied with a reference potential from said reference potential generating circuit;

a second data line paired with said first data line and adapted to be supplied with said reference potential from said reference potential generating circuit;

a word line adapted to be fed with a selection signal;

a dummy word line adapted to be fed with a drive signal which is synchronized with said selection signal;

a dynamic memory cell coupled to said word line and to said first data line, and including an address selecting MOSFET and an information storing capacitor, wherein said dynamic memory cell sets the potential of said first data line at a higher or lower level than the reference potential at said second data line when said dynamic memory cell is selected by said selection signal being fed to said word line;

a sense amplifier for amplifying a level difference which occurs between said first data line and said second data line when said dynamic memory cell is selected; and a dummy capacitor which is coupled between one of said second or first data lines and said dummy word line and which imparts noise to said one of said second or first data line in response to said drive signal being fed to said dummy word line to reduce noise between said first and second data lines which is caused by operation of said address selecting MOSFET when said dynamic memory cell is selected, wherein said dummy capacitor comprises a MOS capacitor, wherein said dummy capacitive element is connected between said dummy word line and said first data line, wherein said drive signal is changed to a predetermined level from a high level in synchronism with the rise of said selection signal to a high level, and wherein said reference potential generating circuit includes a switching element for short-circuiting said first and second data lines to generate said reference potential.

12. A semiconductor memory comprising:

a reference potential generating circuit;

a first data line adapted to be supplied with a reference potential from said reference potential generating circuit;

a second data line paired with said first data line and adapted to be supplied with said reference potential from said reference potential generating circuit;

a word line adapted to be fed with a selection signal;

a dummy word line adapted to be fed with a drive signal which is synchronized with said selection signal;

a dynamic memory cell coupled to said word line and to said first data line, and including an address selecting MOSFET and an information storing capacitor, wherein said dynamic memory cell sets the potential of said first data line at a higher or lower level than the reference potential at said second data line when said dynamic memory cell is selected by said selection signal being fed to said word line;

a sense amplifier for amplifying a level difference which occurs between said first data line and said second data line when said dynamic memory cell is selected; and a dummy capacitor which is coupled between one of said second or first data lines and said dummy word line and which imparts noise to said one of said second or first data line in response to said drive signal being fed to said dummy word line to reduce noise between said first and second data lines which is caused by operation of said address selecting MOSFET when said dynamic memory cell is selected, wherein said dummy capacitor comprises a MOS capacitor, wherein said dummy capacitive element is connected between said dummy word line and said first data line, wherein said drive signal is changed to a predetermined level from a high level in synchronism with the rise of said selection signal to a high level, wherein said first and second data lines have data line capacitances substantially equal to each other, and wherein said dummy capacitor has less capacitance than the gate capacitance of said address selecting MOSFET in an ON state.

13. A semiconductor memory according to claim 11, wherein said dummy capacitor includes a MOSFET having a gate electrode coupled to said dummy word line and a current transfer electrode coupled to said first data line.

14. A semiconductor memory according to claim 13, wherein the MOSFET acting as said dummy capacitor is a depletion mode MOSFET and has less gate capacitance than that of said address selecting MOSFET in an ON state.

15. A semiconductor memory including a first data line, a second data line, reference voltage setting means coupled to said first and second data lines for presetting a predetermined reference potential at each of said first and second data lines, a word line which is fed with a selection signal, a memory cell which is coupled between said first data line and said word line, which has an address selecting MOSFET and a store capacitor and which, in response to said selection signal, varies the potential at said first data line in accordance with information stored in said store capacitor, and amplifier means coupled between said first and second data lines for amplifying a level difference between said predetermined reference potential at said second data line and the potential varied at said first data line, said semiconductor memory comprising:

a signal line which is fed with a drive signal which is synchronized with said selection signal; and dummy capacitor means which is coupled between said signal line and said first and second data line and which imparts noise to said first or second data line in response to said drive signal to reduce noise between said first and second data lines which occurs because of noise imparted to said first data line through a gate capacitance of said address selecting MOSFET, wherein said dummy capacitor means includes a MOS capacitor, and wherein said MOS capacitor includes a MOSFET having a gate electrode coupled to said signal line and a current carrying electrode coupled to said first or second data line, and wherein said MOSFET is a depletion mode MOSFET.

16. A semiconductor memory according to 15, wherein said MOS capacitor is coupled between said signal line and said second data line, and wherein said drive signal is raised to a high level in synchronism with the rise of said selection signal to a high level.

17. A semiconductor memory according to claim 15, wherein said MOS capacitor is coupled between said signal line and said first data line, and wherein said drive signal is changed to a low level from a high level in synchronism with the rise of said selection signal to a high level.

18. A semiconductor memory according to claim 16, wherein said MOS capacitor includes a MOSFET having a gate electrode coupled to said signal line and a current carrying electrode coupled to said second data line.

19. A semiconductor memory according to claim 17, wherein said MOS capacitor includes a MOSFET having a gate electrode coupled to said signal line and a current carrying electrode coupled to said first data line.

20. A semiconductor memory comprising:

first and second data lines paired with each other and respectively coupled to a plurality of dynamic memory cells each including an address selecting MOSFET and an information storing capacitor;

a plurality of word lines coupled to said plural dynamic memory cells;

a reference potential generating circuit for supplying a reference potential to said first and second data lines;

first and second dummy word lines;

a first dummy capacitor connected between said first data line and said first dummy word line;

a second dummy capacitor connected between said second data line and said second dummy word line;

a word line driving circuit for selecting one of said plural memory cells coupled to said first and second data lines;

a dummy word line driving circuit for feeding a drive signal to said first or second dummy word lines in synchronism with the operation of said word line driving circuit to select one of said dummy capacitors to impart noise respectively to either said first or said second data lines to reduce noise between the first and second data lines caused by a capacitance existing in said address selecting MOSFET; and a sense amplifier for amplifying a signal level difference applied between said first and second data lines.

* * * * *